(12) United States Patent
Arai et al.

(10) Patent No.: US 7,989,143 B2
(45) Date of Patent: Aug. 2, 2011

(54) METHOD OF MANUFACTURING A SEMICONDUCTOR DEVICE HAVING AN ORGANIC THIN FILM TRANSISTOR

(75) Inventors: Tadashi Arai, Kumagaya (JP); Takeo Shiba, Kodaira (JP); Masahiko Ando, Hitachinaka (JP); Kazuyoshi Torii, Higashumurayama (JP)

(73) Assignee: Hitachi, Ltd., Tokyo (JP)

( * ) Notice: Subject to any disclaimer, the term of this patent is extended or adjusted under 35 U.S.C. 154(b) by 954 days.

(21) Appl. No.: 11/752,340

(22) Filed: May 23, 2007

(65) Prior Publication Data
US 2007/0281384 A1 Dec. 6, 2007

(30) Foreign Application Priority Data
May 30, 2006 (JP) .................. 2006-149992

(51) Int. Cl.
*G03F 7/26* (2006.01)
(52) U.S. Cl. .................. 430/311; 430/315; 430/331
(58) Field of Classification Search .................. 430/311, 430/315, 331, 313
See application file for complete search history.

(56) References Cited

U.S. PATENT DOCUMENTS

| | | | | |
|---|---|---|---|---|
| 4,610,953 A * | 9/1986 | Hashimoto et al. | ........... | 430/331 |
| 6,403,407 B1 * | 6/2002 | Andry et al. | .................. | 438/158 |
| 6,635,409 B1 * | 10/2003 | Lyons et al. | .................. | 430/313 |
| 2005/0175938 A1 * | 8/2005 | Casper et al. | .................. | 430/319 |
| 2005/0269570 A1 * | 12/2005 | Chabinyc et al. | ................ | 257/61 |
| 2007/0126003 A1 * | 6/2007 | Ando et al. | ...................... | 257/40 |

FOREIGN PATENT DOCUMENTS

| JP | 2003-158134 | 5/2003 |
|---|---|---|
| JP | 2003-321479 | 11/2003 |
| JP | 2004-080026 | 3/2004 |

* cited by examiner

*Primary Examiner* — Kathleen Duda
*Assistant Examiner* — Caleen O Sullivan
(74) *Attorney, Agent, or Firm* — Antonelli, Terry, Stout & Kraus, LLP.

(57) ABSTRACT

An electrode substrate in which a lower electrode and an upper electrode are well positioned by way of an insulating film could not be formed by a printing method since positional displacement is caused. The cost was increased outstandingly when using photomasks for positioning. In the present invention, positional displacement does not occur even when using the printing method since the upper electrode and the lower electrode are positioned in self-alignment. Accordingly, a semiconductor device such as a flexible substrate using an organic semiconductor can be formed with low cost by using the printing method.

25 Claims, 11 Drawing Sheets

METHOD OF MANUFACTURING A SEMICONDUCTOR DEVICE HAVING AN ORGANIC THIN FILM TRANSISTOR

CLAIM OF PRIORITY

The present application claims priority from Japanese application JP 2006-149992, filed on May 30, 2006, the content of which is hereby incorporated by reference into this application.

BACKGROUND OF THE INVENTION

1. Field of the Invention

The present invention relates to a method of manufacturing a semiconductor device having an organic thin film transistor.

2. Description of the Related Art

In recent years, various research and development have been conducted on display apparatus having TFT (Thin Film Transistor). Since TFTs are less power consuming and space saving, they have now been started for use as driving transistors for display devices in portable equipments such as mobile phone, notebook type personal computers, and PDAs. Such TFTs are manufactured mostly with inorganic semiconductor materials typically represented by crystalline silicon or amorphous silicon. This is because they can be manufactured by using existent manufacturing steps and manufacturing techniques in semiconductor devices. However, in a case of using the semiconductor manufacturing steps, since the processing temperature upon forming semiconductor films is 350° C. or higher, substrates that can be formed are restricted. Particularly, most of flexible substrates typically represented by plastic materials have a heat resistant temperature of 350° C. or lower and it is difficult to manufacture TFTs of inorganic semiconductor materials by using usual semiconductor manufacturing steps.

In view of the problem, research and development have been conducted on TFT devices using organic semiconductor materials (hereinafter simply referred to as organic TFT) that can be manufactured at a low temperature. Since organic semiconductor films can be formed at a low temperature, the organic TFT can be formed also on a substrate of low heat resistance such as of plastic materials. Accordingly, a new flexible device not found so far can be manufactured.

For the method of forming the organic semiconductor film upon forming the organic TFT, an optimal method is selected for use, depending on the organic semiconductor materials, from a printing method such as inkjet, a rotary coating method, a spray method, a transfer method, a vapor deposition method, a dipping method, or a cast method. For example, a low molecular compound such as a pentacene derivative is deposited as a film by a vapor deposition method or the like, while a high molecular compound such as a polythiophene derivative is deposited from a solution. Examples regarding the method of manufacturing a semiconductor device having the organic thin film transistor include, for example, those in JP-A-2004-80026. In this example, it is constituted to suppress the amount of use of the organic semiconductor material by using a capillary phenomenon.

Recently, research and development have been conducted for further lowering the cost by manufacturing a channel portion of TFT with a small amount of an organic semiconductor material with no loss by using a printing method typically represented by inkjet, micro dispensing, and transfer method. In addition, research and development have also been started for manufacturing also the electrode and the interconnection with the printing method.

SUMMARY OF THE INVENTION

As has been described above, the method of manufacturing the TFT by using a printing technique has a feature capable of lowering the cost. However, in the usual current printing technique, the positional accuracy is at about 20 μm and it is about several μm even when a modern technique is used. Accordingly, it is difficult to manufacture a fine TFT by the printing method. Particularly in a case where positional displacement should occur for a gate electrode (lower electrode) and source/drain electrodes (upper electrode), it results in a problem of increasing the parasitic capacitance or causing fluctuation for the performance in a case of preparing a plurality of TFTs. It is considered that the positional displacement occurs in the inkjet method upon flying of the material jetted out from a nozzle as far as the substrate. In the transfer method, it is considered that this is caused upon transfer of a material from a transfer roll to a substrate.

Accordingly, at present, there are used a printing step for the formation of the organic semiconductor film and the wiring step, the existent semiconductor step for the formation of an insulating film or contact holes and printing or existent semiconductor step for electrode formation. In this case, since both of the systems are combined, the manufacturing cost is increased because the manufacturing apparatus such as photolithographic apparatus, printing apparatus, deposition apparatus, and etching apparatus are versatile and photomasks are necessary for the contact hole forming step, the electrode forming step, etc.

As the countermeasure, a method with no positional displacement and not requiring the photomask has also been started for study. For example, JP-A-2003-158134 discloses a method of forming a gate pattern with no positional displacement by photolithography from the rear face by using a photosensitive composition and using source and drain electrodes as a mask. By the use of the method, while a pattern with no positional displacement can be formed, since a photolithographic step of the photosensitive composition is included, steps such as coating, heating, exposure, and development of the photosensitive composition are included, which require the cost and the time including those of the apparatus respectively. Further, when a photolithographic step for the photosensitive composition used in the usual semiconductor steps is adopted, it may result in a worry that special substrates such as flexible substrates cannot be used. Further, in a case of using an organic type substrate such as of plastics for the substrate, it may also cause a problem that they are dissolved in solvents for the photosensitive composition.

Further, a method of using photosensitive a self-assembled monolayer (hereinafter referred to as a photosensitive SAM) as the photosensitive composition has also been studied. The photosensitive SAM has a feature in that a non-exposed portion is water repellent and an exposed portion becomes hydrophilic. By utilizing the feature, an electroconductive material is selectively printed in the hydrophilic portion to form electrodes or interconnections. For the photosensitive SAM, silane coupling agents having perfluoro alkyl groups, silane coupling agents having photosensitive groups of the photosensitive composition typically represented by resist, etc. have been reported. For the photosensitive SAM having the perfluoro group, a reaction of disconnecting the main chain by using a light at a short wavelength of about 200 nm is used for developing the hydrophilicity and since light at a wavelength of 300 nm or less does not permeate in usual flexible substrates, the reaction is not taken place by the rear face exposure using the flexible substrate. Further, since the exposure wavelength can be adjusted by changing the photosensitive groups in the photosensitive SAM having a resist photosensitive group, some substrates can conduct reaction by light that transmits the flexible substrate. However, since rinsing is not conducted or rinsing is conducted by an organic solvent after exposure, it also involves a problem to take a lot of time for attaining a predetermined hydrophilicity and, further, no sufficient hydrophilicity can be obtained. While there is a method of increasing the hydrophilicity by a treatment with an inorganic alkali after the organic rinsing, this increases the number of steps and extremely increases the time to form the device.

In view of the foregoing problems, an object of the present invention is to provide a method of manufacturing a high performance organic thin film transistor having a fine pattern shape of about 20 µm in a short time by using a printing method and having a lower electrode and an upper electrode which are positioned with a displacement of 1 µm or less are opposed to each other via an insulating film, without using a photomask.

The invention provides a method of manufacturing a semiconductor device having an organic thin film transistor capable of coping with various kinds of substrates in which the device is formed by using a printing technique, and an upper electrode and a lower electrode are positioned in self-alignment by using the difference of water contact angle between the portion just above the lower electrode and other portions by a photolithographic step by exposure from the rear face using the lower electrode as a mask.

A typical embodiment of the invention uses a manufacturing method of using a step of forming a source and drain electrode material by utilizing the difference of the water contact angle changed by exposure without using a photomask only for the positioning step between the upper electrode and the lower electrode and forming all other steps by a printing method. A non-transparent gate electrode (lower electrode) is prepared by using a transport substrate and conducting printing and baking on the transparent substrate by using a conductive material. Then, a transparent insulating film, a photosensitive self-assembled monolayer changing the water contact angle by exposure, and a solution for the conductive material as the source and drain electrode material are stacked above the lower electrode successively for a necessary area by a printing method. Then, according to the process flow shown in FIGS. 20A to 20D, the photosensitive self-assembled monolayer is exposed from the rear face of the substrate using the lower electrode as a mask and then a pattern of the source and drain electrodes positioned to the lower electrode can be formed by exposing the photosensitive self-assembled monolayer from the rear face of the substrate using the lower electrode as a mask and then conducting rinsing with an aqueous organic alkali solution and then conducting rinsing with water to increase the difference of the water contact angle between the exposed portion and the non-exposed portion, and printing the solution of the conductive material by printing utilizing the difference. Thus, accurate positioning between the lower electrode and the upper electrode is possible. Then, an organic thin film transistor is formed by printing or vapor depositing an organic semiconductor material just above the lower electrode.

The present invention can provide a semiconductor device having an organic thin film transistor having a lower electrode and an upper lower electrode which are positioned with a displacement of 1 µm or less and opposed to each other by way of an insulating film by using a printing method.

DETAILED DESCRIPTION OF THE PREFERRED EMBODIMENTS

Before specifically explaining various embodiments of the present invention, main embodiments of the invention and specific materials used therefor are to be described in details.

The present invention provides a method of manufacturing an organic thin film transistor having, on a substrate comprising a transparent material, a channel portion constituted with an organic semiconductor, an insulating film comprising a transparent material in contact with the channel portion, a gate electrode comprising a non-transparent material in contact with the insulating film, and a pair of source and drain electrodes spaced by the channel portion. One ends (on the side of the gate electrode) of source and drain electrodes are set by exposure from the rear face of the substrate using the gate electrode as a mask region. More preferably, the channel portion, the insulating film, the gate electrode, and the source and the drain electrodes are formed by a printing method.

An example of a step of exposure for setting the ends (on the side of the gate electrode) of source and drain electrodes is described as below. That is, it has a step of forming the non-transparent gate electrode (lower electrode) over a transparent substrate, a step of forming the transparent gate insulating film covering at least the gate electrode, a step of coating a photosensitive self-assembled monolayer, a step of conducting exposure from the rear face of the transparent substrate, a step of rinse cleaning with an aqueous organic alkali solution after exposure and then rinse cleaning with water, a step of forming the source and drain electrode (upper electrode) by printing and baking the solution for the conductive material to the exposed portion, and a step of forming the organic semiconductor layer forming the channel portion. In this case, the upper electrode (source and drain electrodes) and the lower electrode (gate electrode) are formed in a self aligned manner by the process flow shown in FIG. 20A to 20D.

In this case, specific procedures typically include the following two procedures. That is, in the first procedure, the step of forming the organic semiconductor film is conducted before the step of forming the upper electrode material layer. In the second procedure, the step of forming the organic semiconductor film is conducted after the step of forming the upper electrode material layer.

Further, it is more preferred for attaining the purpose of the present invention to conduct all of the step of forming the non-transparent gate electrode, the step of forming the gate insulating film and the step of forming the electrode material layer at least over the gate insulating film by using the printing method.

Typical examples of the coating method includes an inkjet method, microdispensing method, dipping method, rotary coating method, or transfer method. It is practical to use at least one of them for forming various portions.

Then, specific materials used in the present invention are to be described.

Typical examples of the transparent substrate are silicon compounds or organic compounds. Further, specific examples of the transparent substrates are glass plate or quartz substrate, and flexible resin sheet, so-called, plastic film. The plastic film includes, for example, polyethylene terephthalate, polyethylene naphthalate, polyether imide, polyether sulfone, polyether ether ketone, polyphenylene sulfide, polyacrylate, polyimide, polycarbonate, cellulose triacetate, and cellulose acetate propionate. The plastic film has a feature of bending flexibly. This is advantageous for various application uses requiring the flexible feature of the device.

The conductive material is an ink in the form of fine nano particles, complexes, or polymers, and comprising metals, metal oxides, or conductive polymer materials that can be dispersed in a solvent to form a liquid material.

The transparent insulating film materials are organic insulating polymers and include, for example, polyimide derivatives, benzocyclobutene derivatives, photoacryl derivatives, polystyrene derivatives, polyvinyl phenol derivatives, polyester derivatives, polycarbonate derivatives, polyester derivatives, polyvinyl acetate derivatives, polyurethane derivatives, polysulfone derivatives, acrylate resins, acrylic resins, and epoxy resins. In addition, the insulating materials also include inorganic materials such as silicon oxides, silicon nitrides, metal oxides, and metal nitrides. Further, the insulating film may be either a single layer film or a multi-layer film, and the surface may be covered with a metal oxide for forming the photosensitive self-assembled monolayer.

The organic semiconductor material includes, for example, polyacene derivative, typically represented by pentacene and rubrene, polythiophene derivatives, polyethylene vinylene derivatives, polypyrrole derivatives, polyisothianaphthene derivatives, polyaniline derivatives, polyacetylene derivatives, polydiacetylene derivatives, polyazulene derivatives, polypyrene derivatives, polycarbazole derivatives, polyselenophene derivatives, polybenzofuran derivatives, polyphenylene derivatives, polyindole derivatives, polypyridazine derivatives, metallophthalocyanine derivatives, fullerene derivatives, or polymers or oligomers comprising two or more kinds of such repetitive units in admixture. Further, a doping treatment may optionally be applied to the organic semiconductor materials described above. Further, to improve the performance of the organic semiconductor transistor, a surface treatment may also be applied to the bonding surface between the organic semiconductor and the substrate by the step before printing the organic semiconductor. Further, such organic semiconductors may optionally be stacked.

The photosensitive self-assembled monolayer material is a compound having a silane coupling agent at the terminal end, which has a substituent developing the hydroxyl group by exposure. For example, compounds having a series of silane coupling agents in JP-A-2004-80026 can be mentioned.

The aqueous organic alkali solution includes a 2 wt% to 25 wt% aqueous solution, preferably, a 2 wt% to 5 wt% aqueous solution of ammonium hydroxide compounds typically represented by tetramethyl ammonium hydroxide and tetrabutyl ammonium hydroxide.

Examples of the reaction of the photosensitive self-assembled monolayer materials are shown. Description is to be made with reference to chemical formula 1 (5-methoxy-2-nitro-benzyl-4-(trimethoxysilyl)butane sulfonate) shown in JP-A-2003-321479 as an example. In the chemical formula 1

(shown below), bonding is formed on the surface of a metal oxide by using a trimethoxysilyl group.

Chemical formula 1

In a state well-arranged on the surface of a substrate, the water contact angle showed 95°. When light with a wavelength of 350 nm is irradiated to the chemical formula 1, bonding is disconnected to form the chemical formula 2 (shown below) in which a hydroxyl group is formed additionally.

Chemical formula 2

The water contact angle in this state was 40°. When dipping was conducted for one minute using tetramethyl ammonium hydroxide as a rinsing solution and then cleaning with water was conducted, a compound of the chemical formula 3 (shown below) was formed.

Chemical formula 3

The water contact angle in this state was 20°. Further, the water contact angle in the non-exposed portion was 90° throughout the treatments.

The solvent for the conductive material is a solvent to which the conductive material is soluble. Examples usable herein include water, or organic solvents, for example, usual solvents for use in photosensitive compositions such as methyl amyl ketone, ethyl lactate, cyclohexanone, propylene glycol monomethyl ether, propylene glycol-1-monomethyl ether-2-acetate, ethers such as diethyl ether, acetone, and tetrahydrofuran, and toluene, chloroform, and alcohols such as ethanol. Optionally, two or more kinds of mixed solvents may also be used.

Typical examples for the method of forming the photosensitive self-assembled monolayer include an inkjet method, microdispensing method, dip method, rotary coating method or transfer method.

Then, several embodiments of the invention are to be described specifically. In the inkjet printing apparatus used in the embodiment, since both of the positional accuracy and the minimum value for the drawing line width were 20 μm, the gate electrode line width was set to 20 μm.

First Embodiment

FIG. 1 to FIG. 8 are plan views and cross sectional views showing a device in the order of the manufacturing step to form source and drain electrodes by the exposure from the rear face of a substrate, according to a first embodiment. In each of the drawings, "A" is for the upper plan view and "B" is for a cross sectional view taken along line A-A' in "A" of the drawings. In the upper plan views and the cross sectional views of the devices shown in the order of the manufacturing steps in the present specification, "A" is the upper plan view and "B" is the cross sectional view.

Figure 1A:
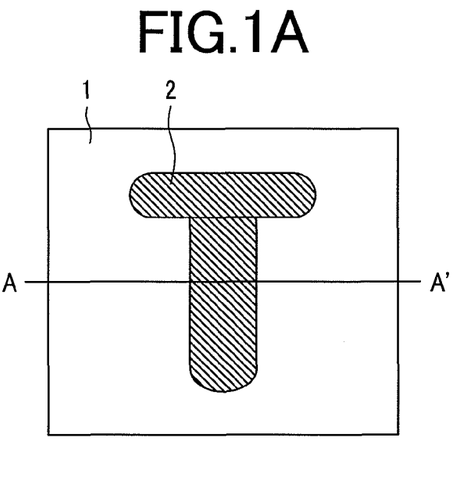
FIGS. 1A and 1B are respectively a plan view and a cross sectional view each showing a transistor in the order of steps of manufacturing the transistor according to a first embodiment of the present invention.
Figure 1B:
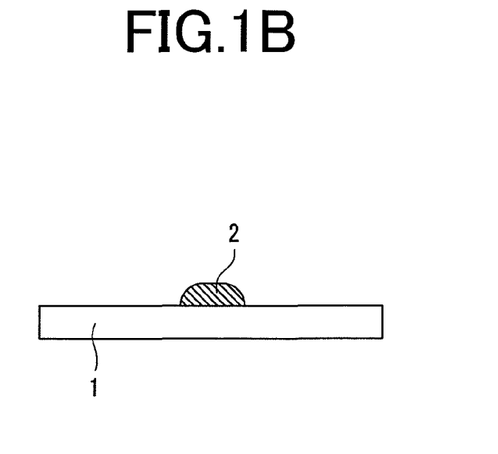

Polycarbonate as an organic compound was used for a transparent substrate 1, and a gate electrode shape of 20 μm line width was printed by using gold nano particles dispersed in a toluene solution as an ink by an ink jet printing method and heating the same at a temperature of 200° C. for 5 minutes to form a gold gate electrode 2 (upper plan view: FIG. 1A, cross sectional view: FIG. 1B). The height of the prepared gate electrode was about 10 μm. The grain size of the metal nuclei of the gold nano particle was 3.5 nm and the periphery of the metal nuclei was coated with butane thiolate. In the upper plan view of FIG. 1A, the gold gate electrode 2 is drawn as a T-shape partitioned into two longitudinal and lateral portions. In the gold gate electrode 2, they integrally constitute a gate electrode portion. Accordingly, it is optional whether the T-shape is formed as an integral portion or with at least two portions. Therefore, the manufacturing methods have advantages and disadvantages. In the inkjet printing of the present embodiment, it is more suitable to constitute it by scanning while dividing the same into two portions. On the other hand, in the case, for example, of a transfer method, it is advantageous to transfer the T-shape as an integral portion. This is identical also for each of the following upper plan views, for example, in FIG. 2A, FIG. 3A, FIG. 4A, FIG. 5A, FIG. 6A—(hereinafter, not all succeeding drawing are illustrated) in which it is depicted as being parted into two portions in the drawings.

Figure 2A:
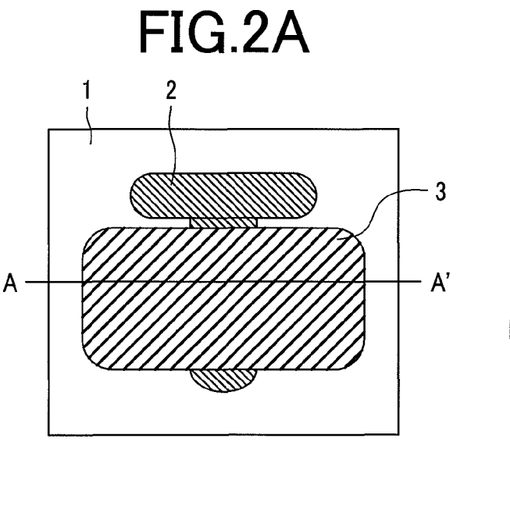
FIGS. 2A and 2B are respectively a plan view and a cross sectional view each showing the transistor in the order of steps of manufacturing the transistor according to a first embodiment of the present invention.
Figure 2B:
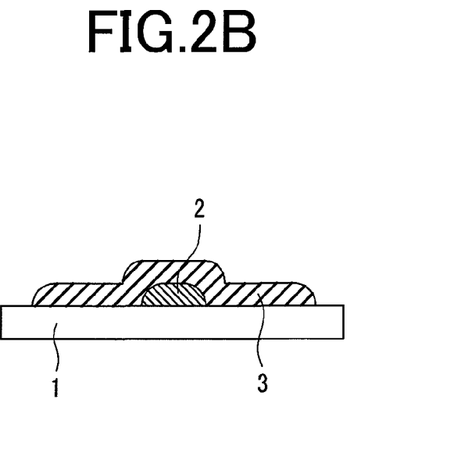
Figure 3A:
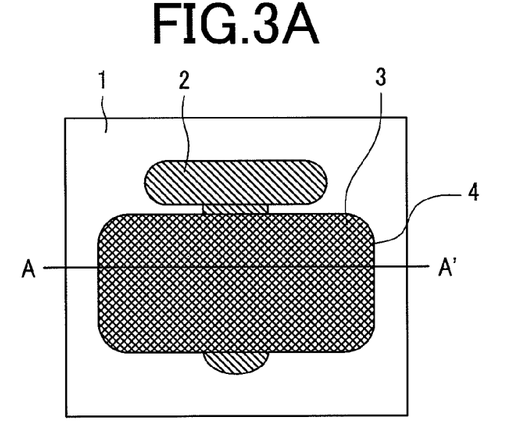
FIGS. 3A and 3B are respectively a plan view and a cross sectional view each showing the transistor in the order of steps of manufacturing the transistor according to a first embodiment of the present invention.
Figure 3B:
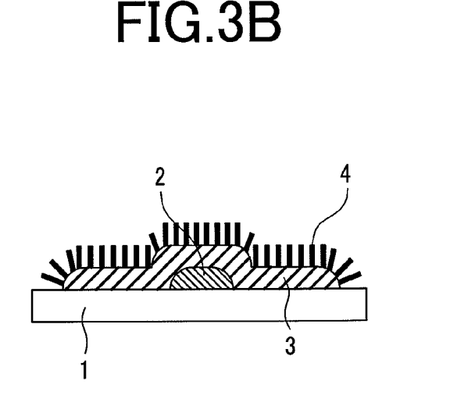

Then, a gate insulating film shape was formed by an inkjet printing method from a 10 wt % solution of poly(methyl silsesquioxane) in methylisobutyl ketone, and heat treatment was applied at a temperature of 150° C. for 20 minutes to form a gate insulating film 3 at a necessary portion (upper plan view: FIG. 2A, cross sectional view: FIG. 2B). The thickness of the gate insulating film 3 was about 100 nm. Considering the positional displacement, it was patterned larger by about 20 μm than the width of the source/drain electrodes to be formed later. Then, the substrate was dipped for 10 minutes as in a 0.1 wt % toluene solution of a photosensitive self-assembled monolayer material (5-methyloxy-2-nitro-benzyl 4(trimethoxysilyl)butanesulfonate), rinsed with toluene, dried, and then baked at a temperature of 110° C. for 10 minutes to form a photosensitive self-assembled monolayer 4 on the insulating film 3 (upper plan view: FIG. 3A, cross sectional view: FIG. 3B). The water contact angle of the self-assembled monolayer before exposure was 95°.

Figure 4A:
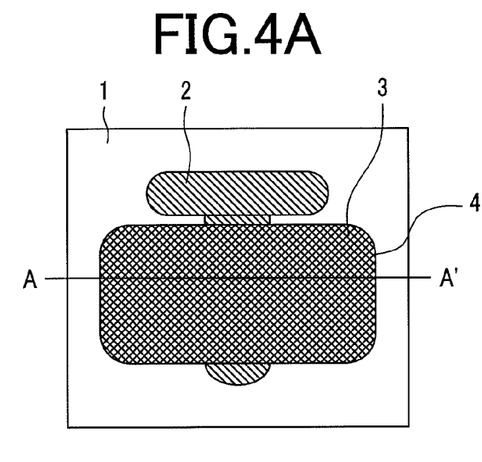
FIGS. 4A and 4B are respectively a plan view and a cross sectional view each showing the transistor in the order of steps of manufacturing the transistor according to a first embodiment of the present invention.
Figure 4B:
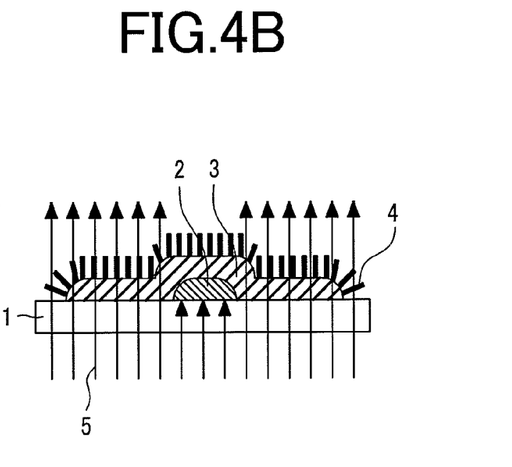
Figure 5A:
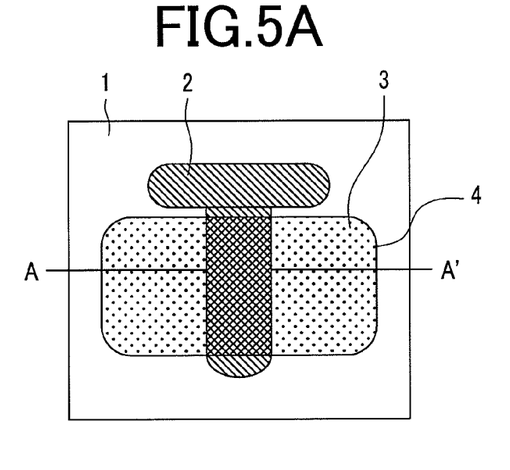
FIGS. 5A and 5B are respectively a plan view and a cross sectional view each showing the transistor in the order of steps of manufacturing the transistor according to a first embodiment of the present invention.
Figure 5B:
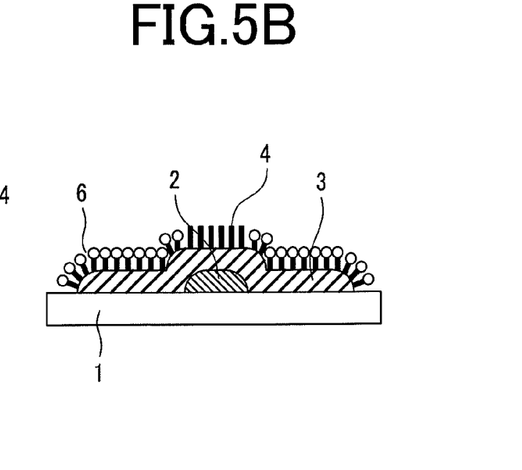
Figure 6A:
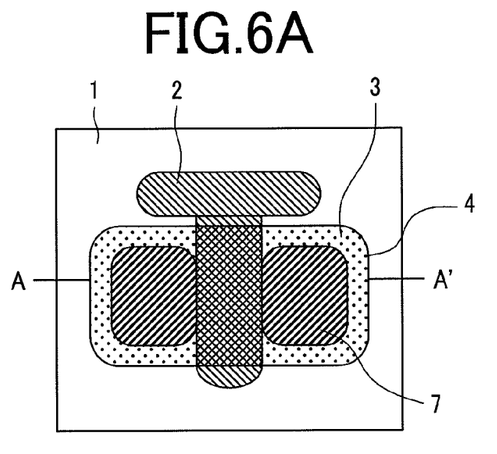
FIGS. 6A and 6B are respectively a plan view and a cross sectional view each showing the transistor in the order of steps of manufacturing the transistor according to a first embodiment of the present invention.
Figure 6B:
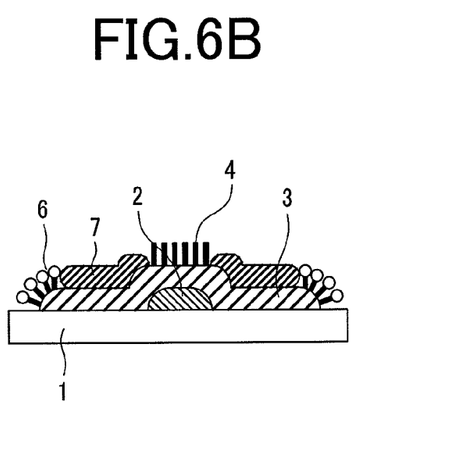

Exposure was conducted for 20 minutes by using a high pressure mercury lamp from the rear face of the substrate (upper plan view: FIG. 4A, cross sectional view: FIG. 4B). After exposure, it was dipped in an aqueous 2.38 wt % solution of tetramethyl ammonium hydroxide and then cleaned with deionized running water for 2 minutes (upper plan view: FIG. 5A, cross sectional view: FIG. 5B). At the end of the step, the water contact angle of the self-assembled monolayer was 20° for the exposed area and was 95° with no change for the non-exposed portion. Source and drain electrodes 7 were printed by the same solution of gold nano particles as for the gate preparation material by an inkjet method to the exposed portion and baked at a temperature of 200° C. for 5 minutes (upper plan view: FIG. 6A, cross sectional view: FIG. 6B). The thickness of the electrode pattern 7 was about 5 μm. The positional displacement between the gate electrode and the source and drain electrodes was 0.5 μm.

Figure 7A:
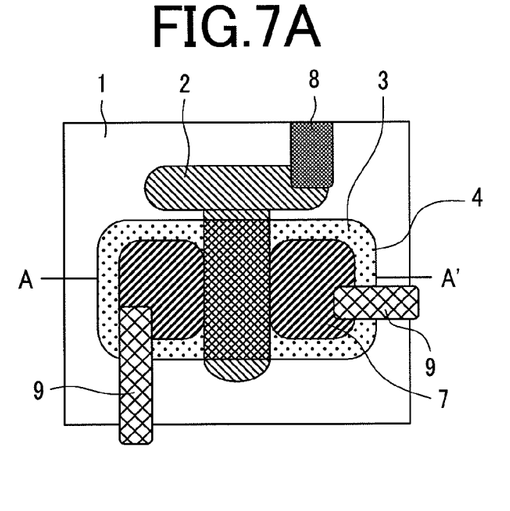
FIGS. 7A and 7B are respectively a plan view and a cross sectional view each showing the transistor in the order of steps of manufacturing the transistor according to a first embodiment of the present invention.
Figure 7B:
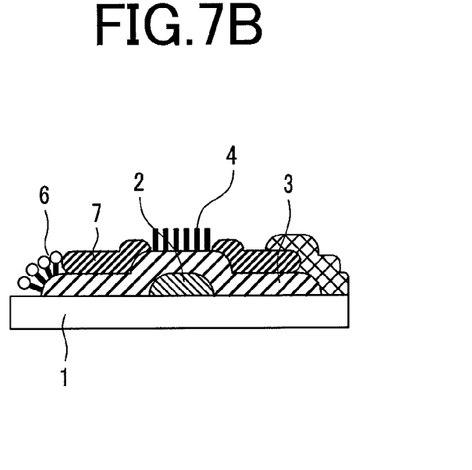
Figure 8A:
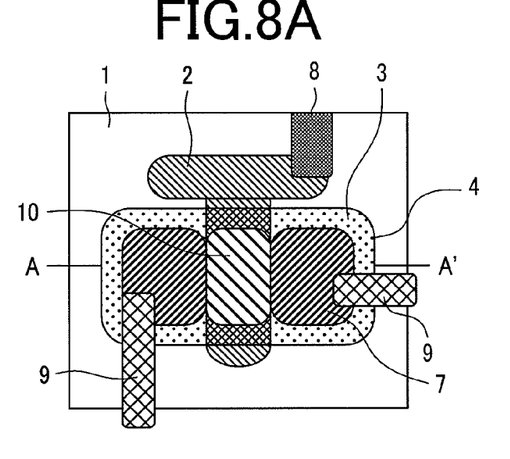
FIGS. 8A and 8B are respectively a plan view and a cross sectional view each showing the transistor in the order of steps of manufacturing the transistor according to a first embodiment of the present invention.
Figure 8B:
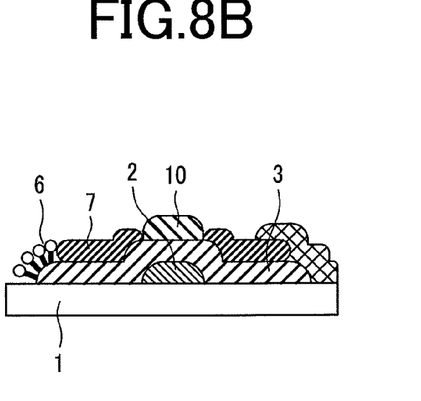

Then, an interconnection 8 and an interconnection 9 were printed by an inkjet printing method using the same toluene solution of gold nano particles as that for the gate electrode and applied with a heat treatment at a temperature of 200° C. for 5 minutes (upper plan view: FIG. 7A, cross sectional view: FIG. 7B). The thickness of the interconnection was 0.5 μm. Then, a channel portion 10 was printed between the source electrode 7 and the drain electrode 7 just above the gate electrode 2 by an inkjet printing method using a 5% chloroform solution of an organic semiconductor (Poly (3-hexylthiophene-2,5-diyl)Regioregular) and applied with a heat treatment at a temperature of 180° C. for 2 minutes (upper plan view: FIG. 8A, cross sectional view: FIG. 8B). The thickness of the channel portion 9 was 5 μm.

The mobility of the transistor was 0.085 cm$^2$/Vs. The value shows the characteristic of an organic thin film transistor for which it is considered no positional displacement between both of upper and lower electrodes.

The insulating film 3 and the organic semiconductor layer 10 can also be formed by the rotary coating. The mobility of organic thin film transistor formed by the rotary coating method was similar to the above transistor. However, the printing method, when compared with the case of forming the layer by the rotary coating, shows no wasteful loss for the amount of solutions to be used and is, therefore, advantageous.

Second Embodiment

Figure 9:
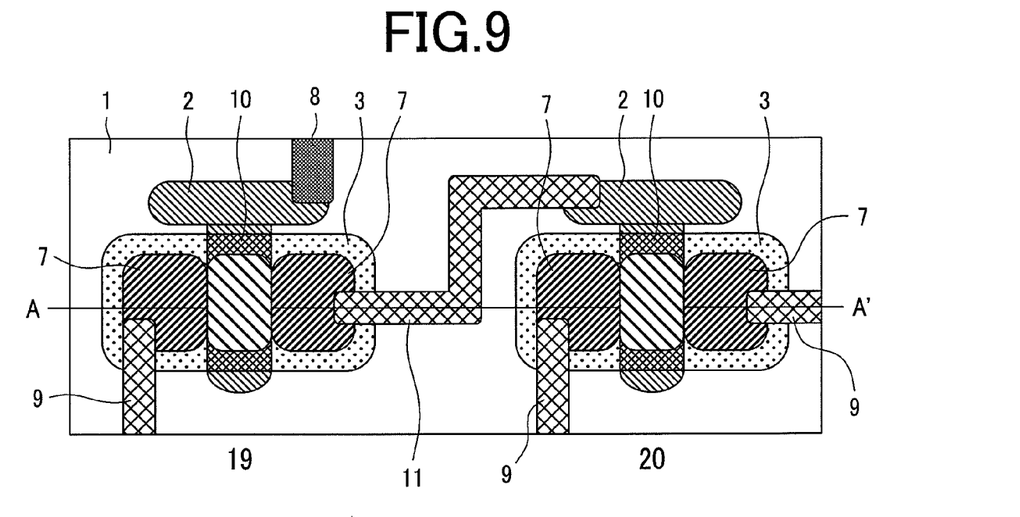
FIG. 9 is a plan view showing a semiconductor device having a transistor in the order of steps of manufacturing the semiconductor device according to a second embodiment of the present invention.
Figure 10:
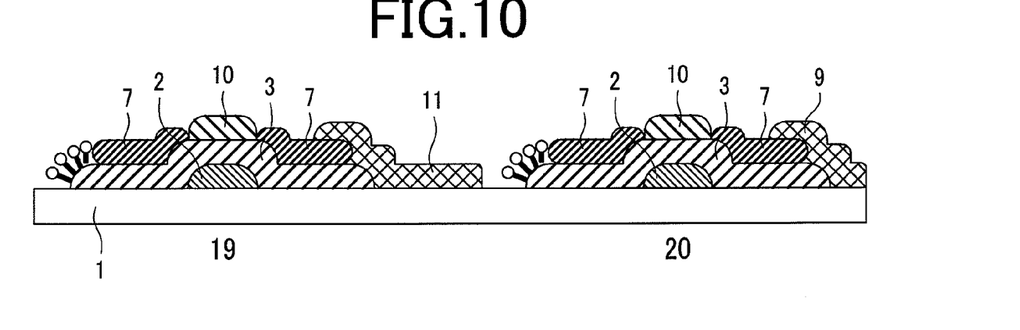
FIG. 10 is a cross sectional view showing the semiconductor device having the transistor in the order of steps of manufacturing the semiconductor device according to the second embodiment of the present invention.

This embodiment is an example of forming organic semiconductor transistors by the number of two (19, 20) by the same method as in the first embodiment. FIG. 9 and FIG. 10 show the upper plan view and the cross sectional view of this embodiment. While the method of forming each of the transistors is similar to that for the first embodiment described previously, a drain electrode 6 of a first transistor 19 and a gate electrode 2 of a second transistor 20 are connected by an interconnection 11 after forming each of the transistors in the configuration of the present embodiment. FIG. 9 shows an upper plan view and FIG. 10 shows a cross sectional view taken along cross section A-A' in FIG. 9. The performance of both of the transistors was quite identical and transistors with less fluctuation of the performance could be prepared.

The first and the second embodiments show typical examples having particularly high performance in view of both the cost and the performance. Now, other examples of changing the materials, etc. in the above mentioned embodiments are to be described below.

For the substrate, an organic thin film transistor was formed quite in the same manner as in the first embodiment except that the transparent substrate in the first embodiment is replaced with a glass substrate formed of a silicon compound. The mobility of the transistor was 0.11 cm$^2$/Vs, which was the same as that of the plastic substrate.

For the conductive material, a transistor was formed quite in the same manner as in the first embodiment except that the gold nano particles in the first embodiment are replaced with silver nano particles. The mobility of the transistor was 0.077 cm$^2$/Vs. In the case of using platinum nano particles, the mobility was 0.1 cm$^2$/Vs. In the case of copper nano particles, the mobility was 0.08 cm$^2$/Vs which showed the same performance as that in the case of using gold nano particles. In each of the various materials described above, while there is a difference in view of the characteristics, for example, due to the difference of the work function between gold and silver, the purpose of the present invention can be attained sufficiently. Among the materials, the gold nano particles are most advantageous in various aspects in view of the performance, ease of synthesis and stability of storage. Further, in the case of using doped PEDOT which is a conductive polymer, the mobility was 0.08 cm$^2$/Vs showing the performance similar to that in the case of using metal nano particles.

For the organic Semiconductor material, a transistor was formed quite in the same manner as the first embodiment except that the solution for the gold nano particles in the first embodiment is replaced, for example, with an emeraldin salt-doped polyaniline solution. The mobility of the transistor was 0.05 cm$^2$/Vs. The purpose of the present invention could be attained sufficiently also in such an example.

Further, a transistor was formed by using an organic semiconductor: poly (styrenesulfonate)/poly (s,3-dihydrothieno-[3,4-b]-1,4-dioxin) as an aqueous 3 wt % solution. The mobility of the transistor was 0.078 cm$^2$/Vs. This example was somewhat advantageous in view of the cost.

Further, in the case of using pentacene by using a vapor deposition method, the mobility was 0.09 cm$^2$/Vs. While the printing method is not used, there is no substantial difference in view of the cost because of partial replacement.

For the insulating film, in the case of using epoxydized polybutadiene as a 0.5% xylene solution instead of the insulating film of the first embodiment, the mobility was 0.09 cm$^2$/Vs. The value is substantially identical with the value of the first embodiment. This embodiment was somewhat advantageous in view of the cost.

Further, the mobility was 0.07 cm$^2$/Vs in the case of using polyhydroxystyrene as a 2% methyl amyl ketone solution for the insulating film and the purpose of the present invention can be attained. Polyhydroxystyrene in this embodiment has a merit capable of using methyl amyl ketone which is an inexpensive and safe solvent. Further, the mobility is 0.07 cm$^2$/Vs in the case of using a polyamide as a 3% methyl amyl ketone and the purpose of the present invention can be attained. In this case, since the transmittance is somewhat lowered, exposure time for the photosensitive self-assembled monolayer increases.

In the case of using the organic polymer compounds described above for the insulating film, it is necessary to form a siloxane compound film or a silazane compound film on the surface of the insulating film for forming the photosensitive self-assembled monolayer and the cost and the number of steps increase somewhat.

Several examples of the various materials described above has been described specifically.

The present invention has been described above in details. According to the invention, in the organic semiconductor manufacturing step, (1) a necessary material is drawn in a necessary area by the printing method and (2) a portion where positioning is necessary for the lower electrode and the upper electrode is prepared by positioning the lower electrode and the upper electrode in self-alignment. Accordingly, an electrode substrate in which the lower electrode and the upper electrode are accurately positioned by way of the insulating film can be formed by using the printing method. By the use of the printing method according to the invention, it may suffice to use necessary materials for the minimum area. In addition, neither the photomask nor the resist lithographic step is necessary, and etching step for the preparation of through holes is not required. Accordingly, the manufacturing cost can be saved greatly.

In the present invention, since all the steps can be conducted at low temperature, even in the case where the substrate is formed of a material such as a plastic which is flexible and having a thermoplasticity capable of thermally deforming, it can be formed by self-alignment of an upper interconnection/electrode to the lower electrode. This is suitable for a substrate for preparing a flexible display such as electronic paper using the substrate described above.

Third Embodiment

Figure 11A:
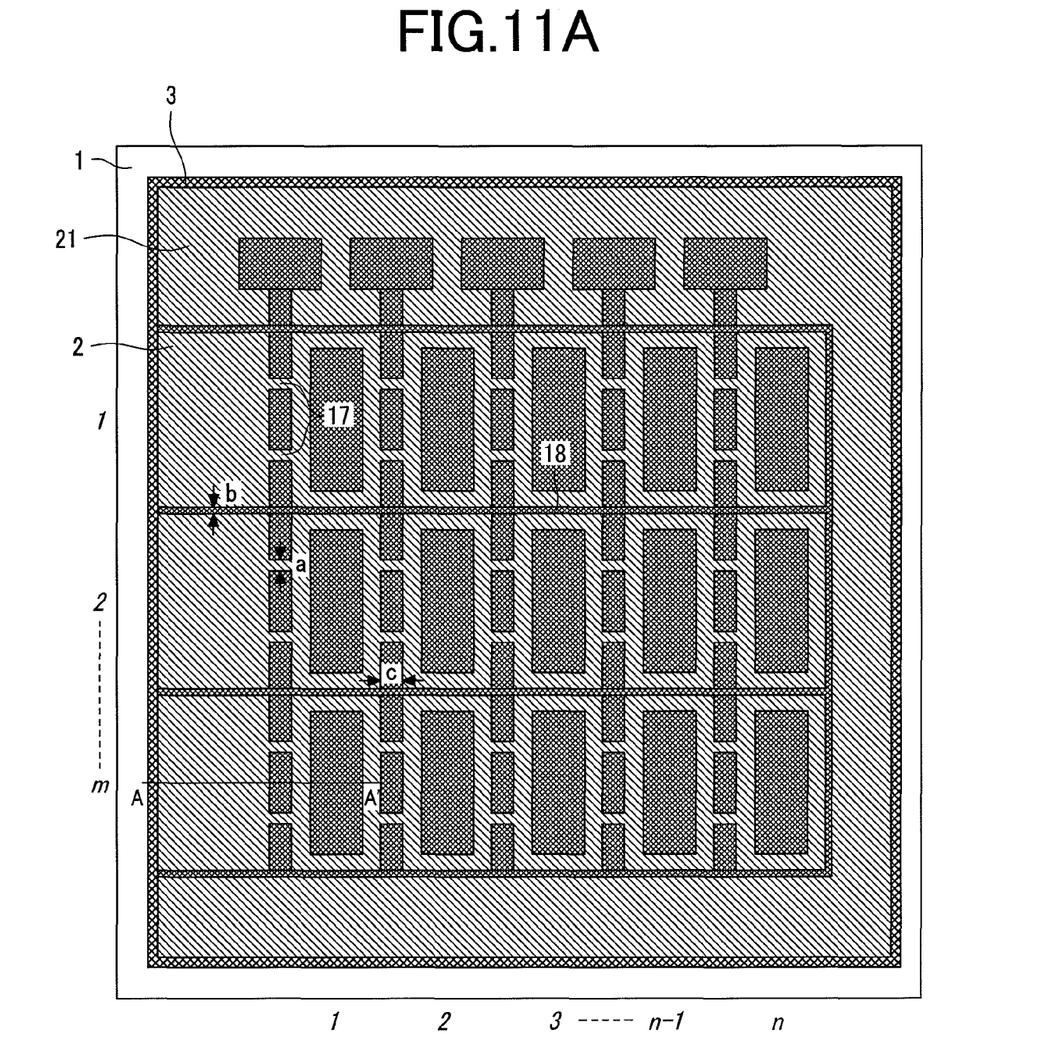
FIGS. 11A and 11B are respectively a plan view and a cross sectional view each showing a transistor in the order of steps of manufacturing the transistor according to a third embodiment of the invention.
Figure 11B:
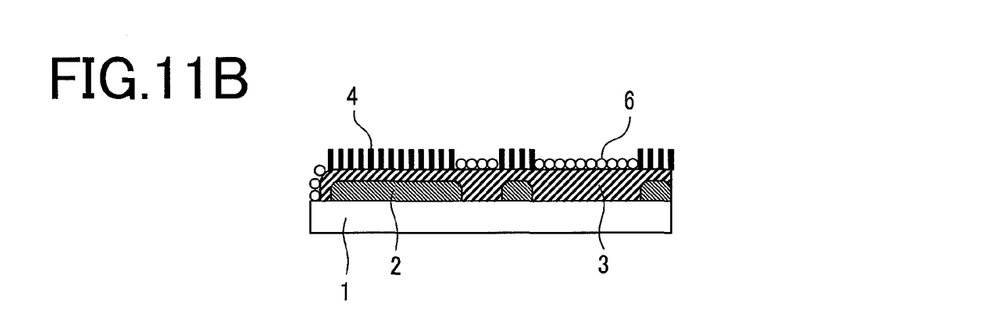

In this embodiment, an m×n active matrix type thin film transistor substrate comprising thin film transistors in m rows and n columns, and a manufacturing method thereof are to be described with reference to FIGS. 11 to 14. The active matrix type thin film transistor substrate is formed at intersections between m number of gate electrodes each constituting at least a portion of a lower electrode and n number of signal interconnections each constituting at least a portion of the upper electrode. Fundamental preparation procedures are similar to those for the first embodiment. At first, m number of gate interconnections/electrodes 2 in which n number of ring-shaped rectangles each having an opening and disposed in adjacent with each other are connected at least at one or more connection portions 17 (two positions in this embodiment) are disposed in close adjacent with each other by way of a gap 18 (upper plan view: FIG. 11A, cross sectional view: FIG. 11B). Particularly, by defining the width b for the gap 18 and the width a for each of the connection portions 17 to a width not larger than the gap c between each of the rectangles having the ring-shaped opening, n number of upper electrodes 23 that each function as the signal interconnection/drain electrode can be formed in a linear shape in self-alignment with the lower electrode continuously while overriding a hydrophilic region above the connection portion 17 by coating and baking the solution for the conductive material to the gaps c. There is no possibility that the conductive material solution penetrates in the gap 18 to short circuit the upper electrodes 23 to each other.

Figure 12A:
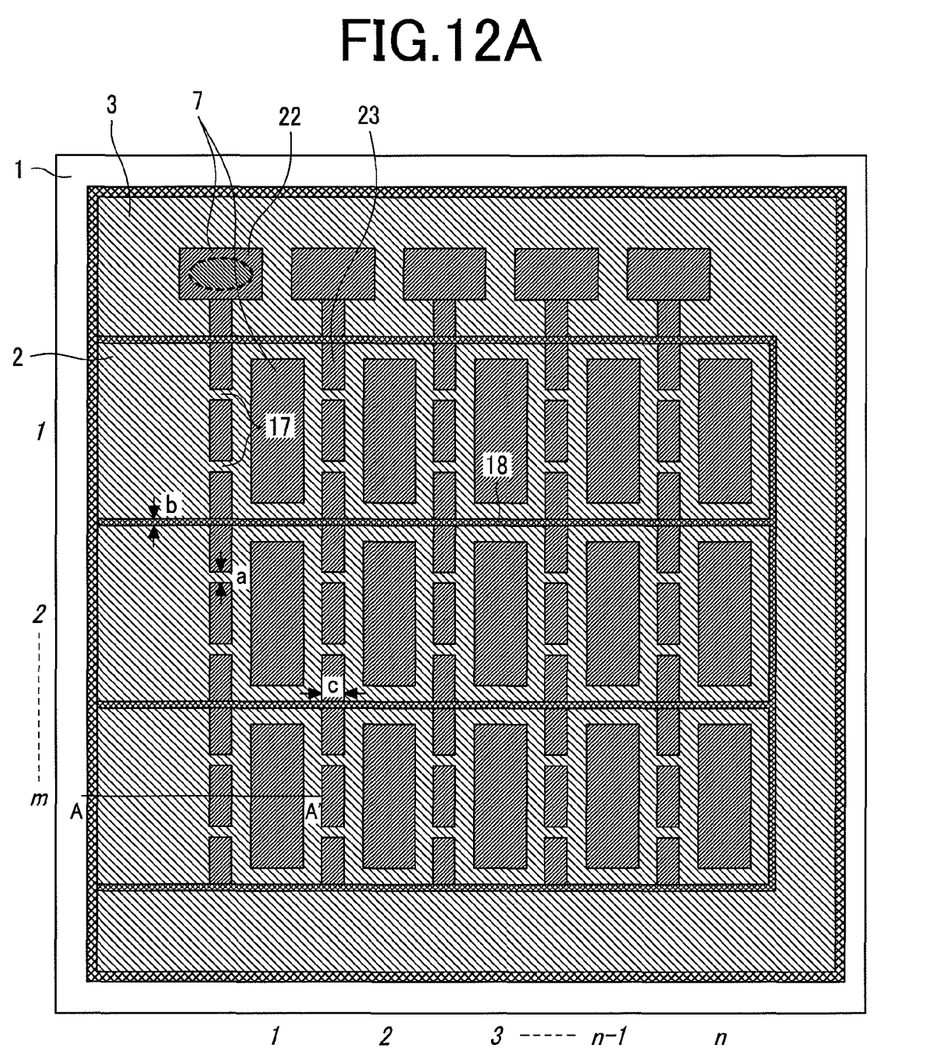
FIGS. 12A and 12B are respectively a plan view and a cross sectional view each showing the transistor in the order of steps of manufacturing the transistor according to the third embodiment of the invention.
Figure 12B:
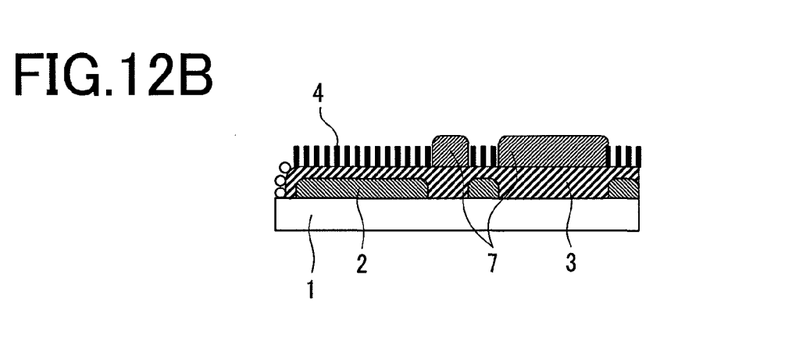
Figure 13A:
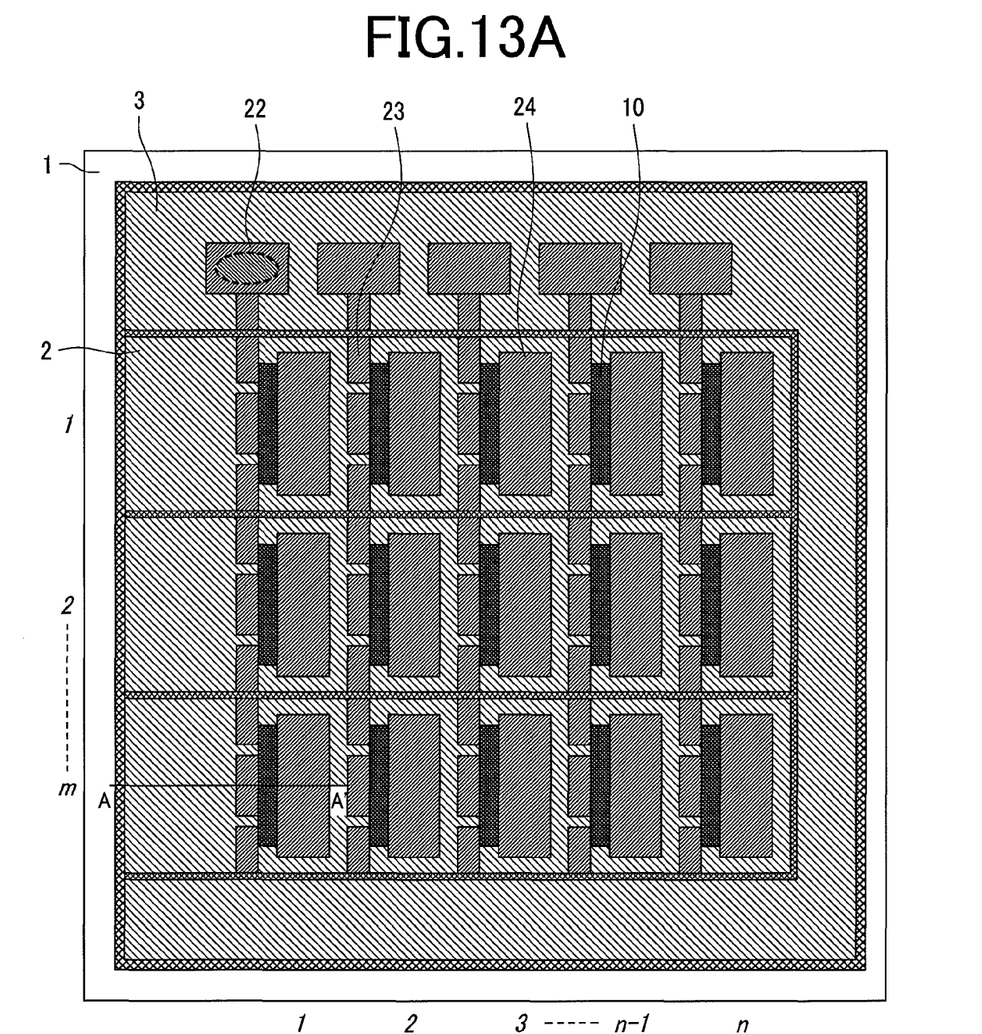
FIGS. 13A and 13B are respectively a plan view and a cross sectional view each showing the transistor in the order of steps of manufacturing the transistor according to the third embodiment of the invention.
Figure 13B:
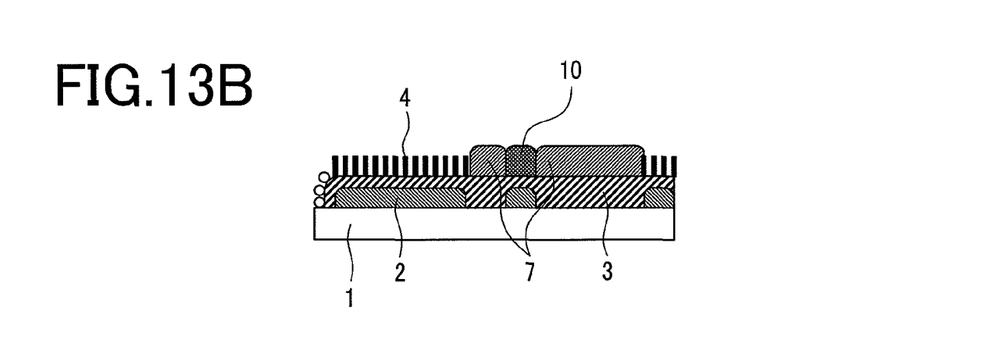
Figure 14A:
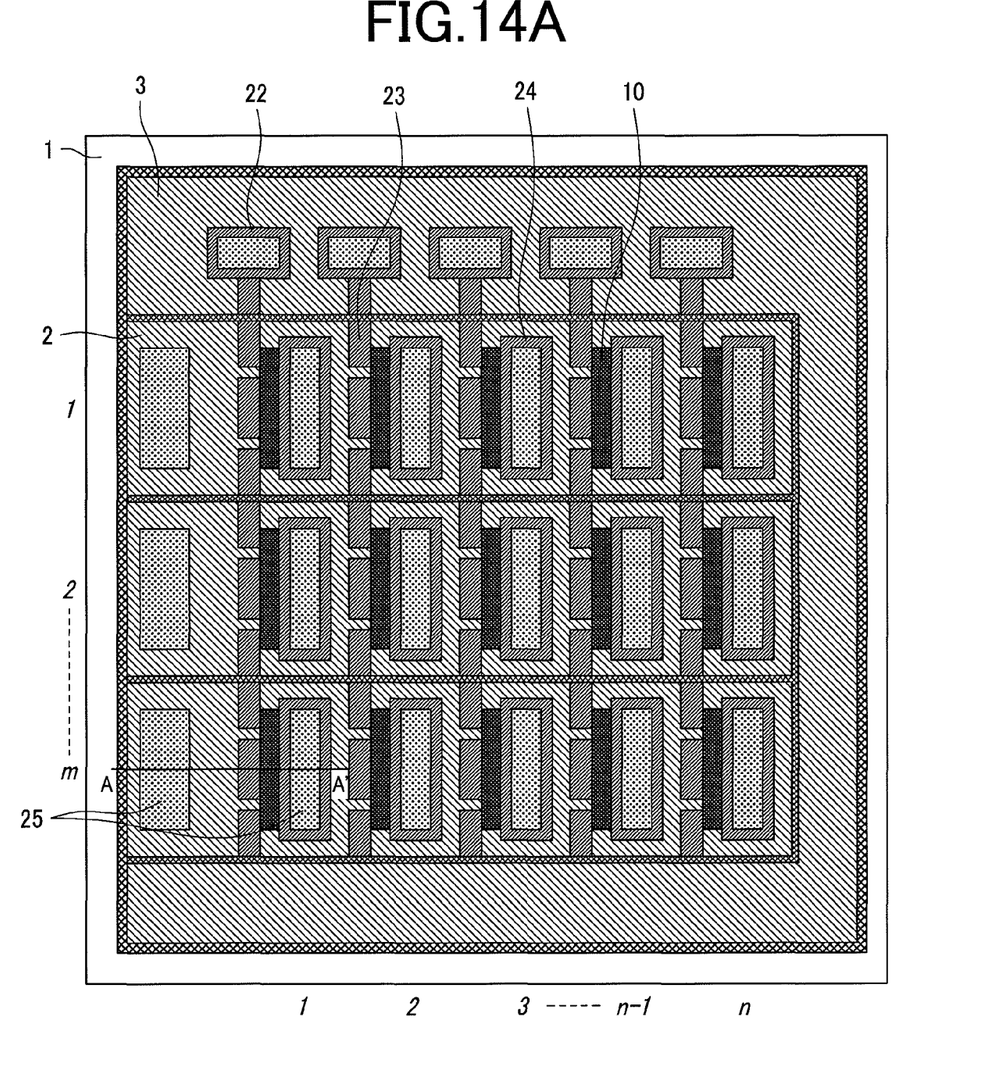
FIGS. 14A and 14B are respectively a plan view and a cross sectional view each showing the transistor in the order of steps of manufacturing the transistor according to the third embodiment of the invention.
Figure 14B:
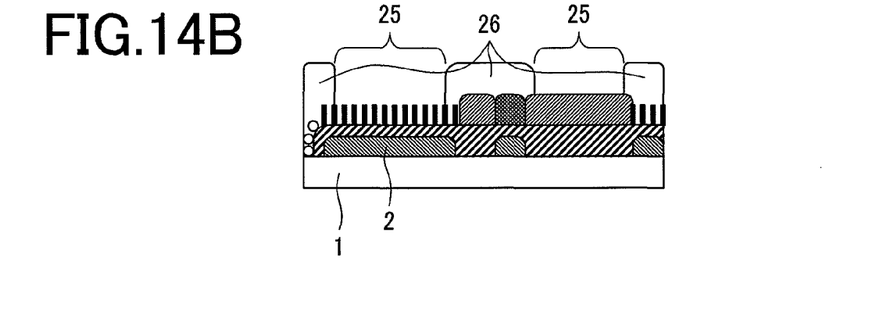

Further, in this embodiment, a lower electrode 21 for forming a terminal formed integrally is arranged as a portion of the lower electrode 2 so as to surround the outer periphery of m number of the gate interconnections/electrodes 2. To prevent the upper electrode 23 from being formed to the end of the substrate 1 which is positioned at the outside of the lower electrode 21 for forming the terminal, a seal mask may be bonded to the portion and peeled after forming the upper electrode 23. Further, in this embodiment, the width for the signal terminal portion 22 of the lower electrode 21 for forming the terminal was made larger than the upper electrode width c. This is not only for making the area of the upper electrode terminal larger thereby lowering the contact resistance with a signal circuit to be described later but also for utilizing the same as an ink reservoir for coating to form a relatively long signal interconnection 23 by the conductive material solution. That is, it functions such that in the case where the conductive material solution dropped along the gap of the width c for forming the signal interconnection 23 is excessive, the conductive material solution flows into the signal terminal portion 22, whereas in the case where it is insufficient, the conductive material solution is supplied from the signal terminal 22 thereby forming the upper electrode 23 by an appropriate amount of the conductive material solution (upper plan view: FIG. 12A, cross sectional view: FIG. 12B). M×n number of thin film transistors are formed at the intersections between m number of the gate interconnections and n number of the signal interconnections 23 by forming a semiconductor film 10 on the electrode substrate by the same method and with the same material as those for the third embodiment (upper plan view: FIG. 13A, cross sectional view: FIG. 13B). Further, a protective film 26 is formed thereover in this case. Through holes 25 are formed and interconnection is conducted. In this way, a substrate for active matrix type thin film transistors disposed in self-alignment can be formed (upper plan view: FIG. 14A, cross sectional view: FIG. 14B). When the matrix of transistors was prepared as described above and the performance of the respective transistors was compared, it has been found that those with no fluctuation and having quite identical performance could be prepared.

COMPARATIVE EXAMPLE 1

A TFT was prepared by using an organic semiconductor by the same method as for the first embodiment except that the treatment step with an aqueous organic alkali solution is replaced with a toluene treatment step after exposure. In order to adjust the water contact angle of the exposed portion to the lower limit, it was necessary to dip the same together with the substrate in toluene and apply supersonic cleaning for 30 minutes. It required a treating time of ten times or more compared with the treating method by an aqueous organic alkali solution. The water contact angle in this state was 40°.

COMPARATIVE EXAMPLE 2

By the same method as for the first comparative embodiment, a substrate with the water contact angle for the exposed portion of 40° was dipped in an aqueous 1% sodium hydroxide solution and cleaned with water. In this state, the water contact angle was changed to 20°. When an organic TFT was prepared by the same method as for the first embodiment in the succeeding steps, the transistor operation could not be obtained.

Fourth Embodiment

Figure 15A:
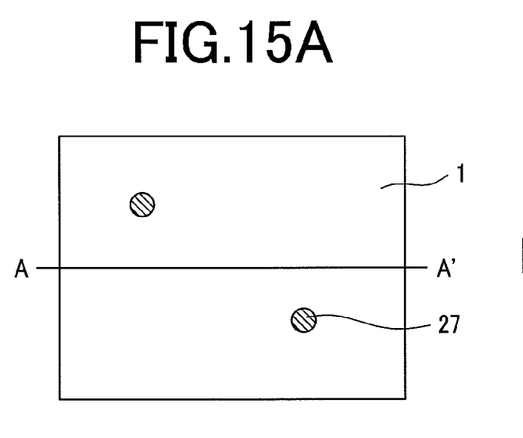
FIGS. 15A and 15B are respectively a plan view and a cross sectional view each showing a wiring substrate in the order of steps of manufacturing the wiring substrate according to a fourth embodiment of the present invention.
Figure 15B:
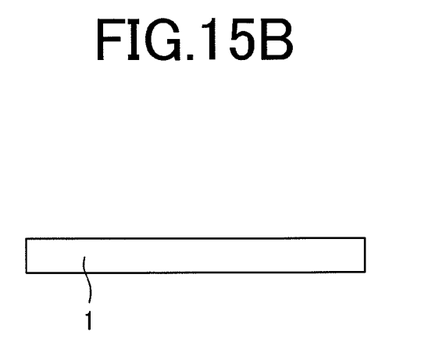
Figure 16A:
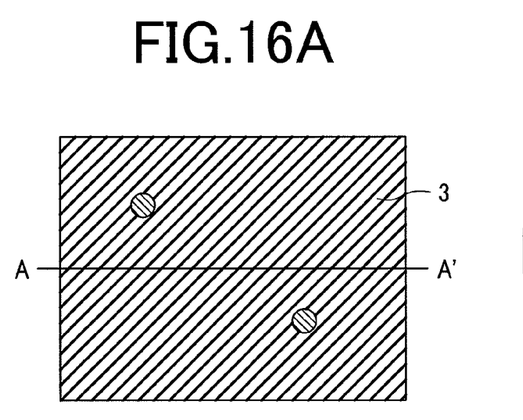
FIGS. 16A and 16B are respectively a plan view and a cross sectional view each showing the wiring substrate in the order of steps of manufacturing the wiring substrate according to the fourth embodiment of the present invention.
Figure 16B:
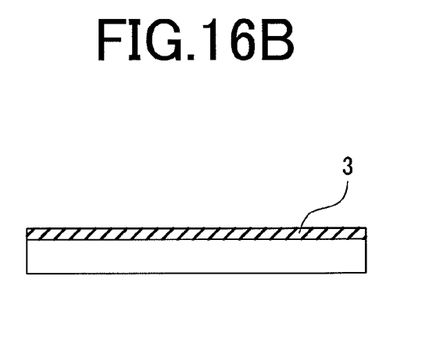

A printed substrate 1 (made of epoxy resin) only applied with fabrication of through holes 27 (upper plan view: FIG. 15A, cross sectional view: FIG. 15B) was provided and the interconnection was prepared. Poly(methylsilsesquioxane) as a 2 w % methyl isobutyl ketone solution was coated on the substrate by rotary coating and applied with a heat treatment at a temperature of 150° C. for 20 minutes (upper plan view: FIG. 16A, cross sectional view: FIG. 16B).

Figure 17A:
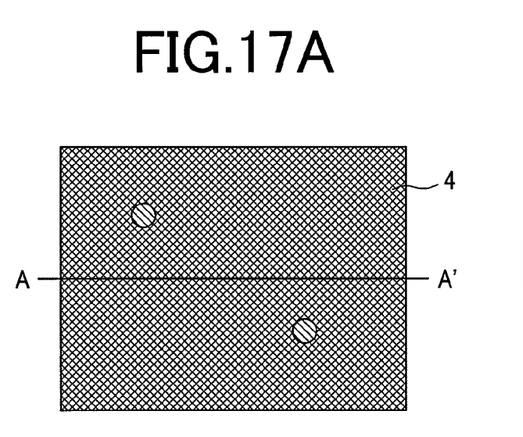
FIGS. 17A and 17B are respectively a plan view and a cross sectional view each showing the wiring substrate in the order of steps of manufacturing the wiring substrate according to the fourth embodiment of the present invention.
Figure 17B:
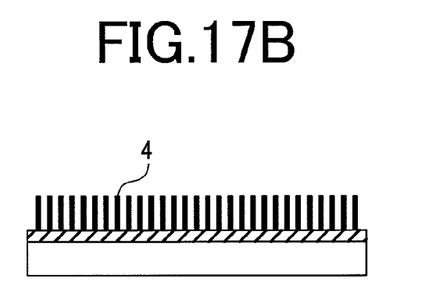
Figure 18A:
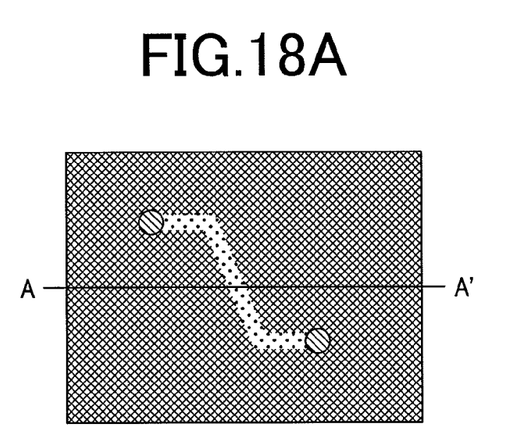
FIGS. 18A and 18B are respectively a plan view and a cross sectional view each showing the wiring substrate in the order of steps of manufacturing the wiring substrate according to the fourth embodiment of the present invention.
Figure 18B:
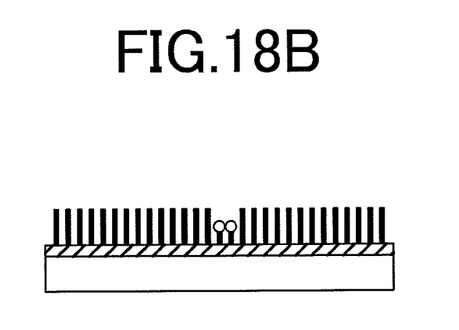
Figure 19A:
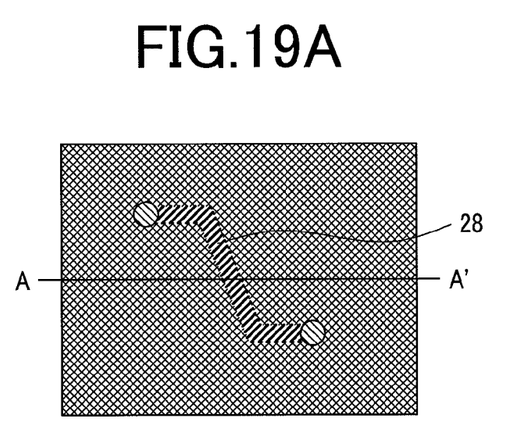
FIGS. 19A and 19B are respectively a plan view and a cross sectional view each showing the wiring substrate in the order of steps of manufacturing the wiring substrate according to the fourth embodiment of the present invention.
Figure 19B:
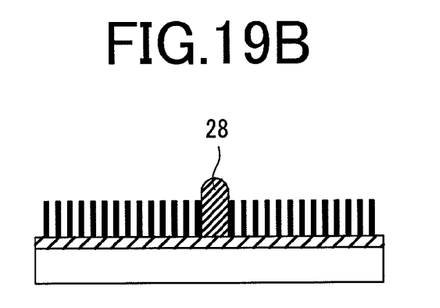
Figure 20:
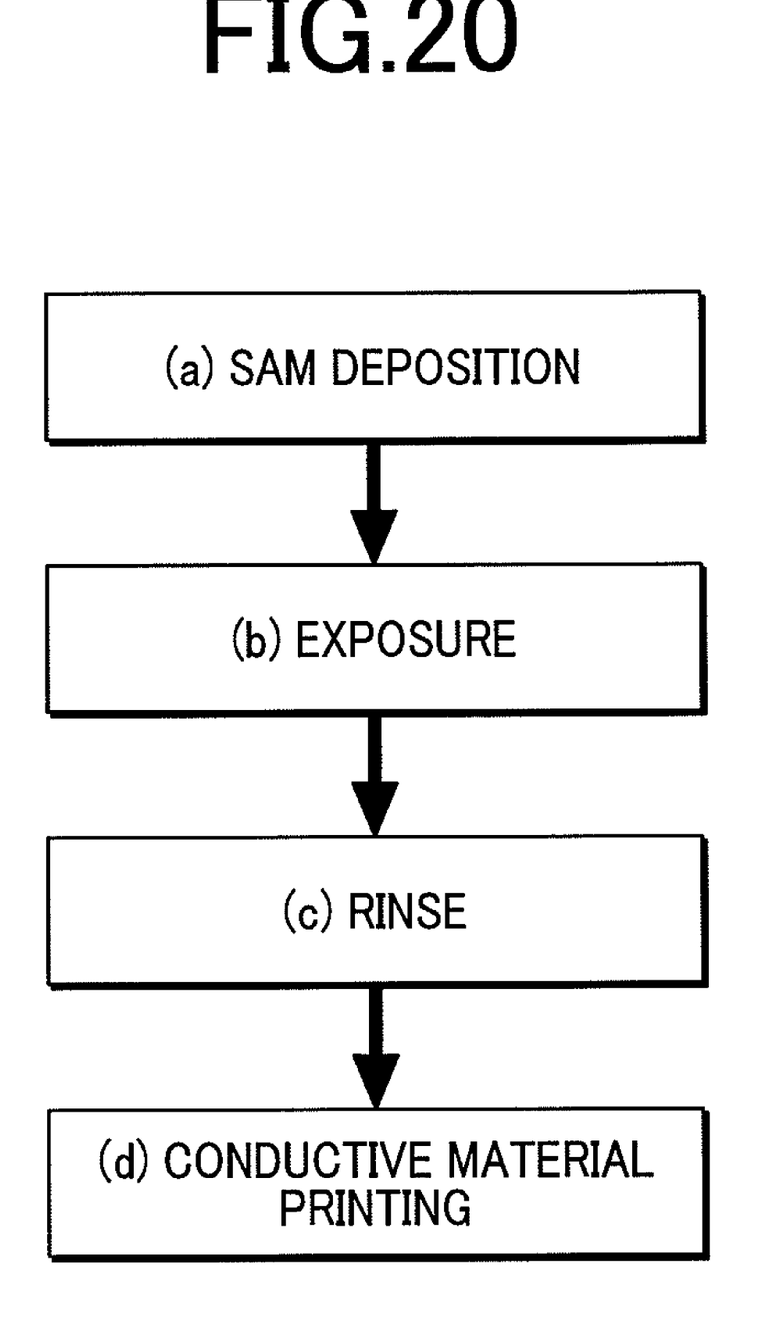
FIG. 20 is a view showing a process flowchart of forming a self-aligned electrode according to the present invention.

Then, the substrate was dipped for 10 minutes in a 0.1 wt % toluene solution of the photosensitive self-assembled monolayer material (5-methoxy-2-nitro-benzyl4-(trimethoxysilyl) butanesulfonate), rinsed with toluene, dried and then baked at a temperature of 110° C. for 10 minutes to form a photosensitive self-assembled monolayer 4 (upper plan view: FIG. 17A, cross sectional view: FIG. 17B). Exposure between through holes was conducted at a wavelength of 355 nm using a laser exposure machine having a pattern drawing function. Then, the substrate was dipped for one minute in an aqueous 2.38 wt % solution of tetramethyl ammonium hydroxide and then cleaned with water (upper plan view: FIG. 18A, cross sectional view: FIG. 18B). A pattern was drawn using cupper nano particles dispersed in a toluene solution as an ink to the exposed portion by an inkjet method, and baked at a temperature of 180° C. for 10 minutes to form an interconnection 28 between the through holes (upper plan view FIG. 19A, cross sectional view: FIG. 19B). This could be used with no difference with commercial wiring substrates.

DESCRIPTION FOR REFERENCES USED IN THE DRAWINGS OF THE APPLICATION IS AS DESCRIBED BELOW.

1 ... substrate
2 ... lower electrode (gate interconnection/electrode)
3 ... gate insulating film
4 ... photosensitive self-assembled monolayer
5 ... exposure light
6 ... self-assembled monolayer with water contact angle being decreased by organic alkali treatment after exposure
7 ... upper electrode (source and drain electrode)
8 ... interconnection
9 ... interconnection
10 ... organic semiconductor
11 ... interconnection
17 ... connection portion for gate interconnection
18 ... gap between adjacent gate interconnection/electrodes
21 ... lower electrode for forming signal terminal
22 ... signal terminal
23 ... source electrode
24 ... drain electrode
25 ... through hole
26 ... protective film
27 ... through hole
28 ... interconnection

What is claimed is:

1. A method of manufacturing a semiconductor device comprising the steps of:
   forming a lower electrode above a substrate;
   forming an insulating film so as to cover the lower electrode;
   selectively forming source and drain electrodes on the insulating film; and
   selectively forming, on the insulating film, a channel portion comprising an organic semiconductor so as to be put between the source and drain electrodes, with one end thereof being in contact with the source electrode and the other end thereof being in contact with the drain electrode; wherein
   the source and drain electrodes are formed by depositing a photosensitive self-assembled monolayer on the insulating film, irradiating exposure light to a predetermined region for forming the source and drain electrodes, rinsing the photosensitive self-assembled monolayer after irradiation using an aqueous organic alkali solution and water so as to increase a difference of water contact angle between portions of the photosensitive self-assembled monolayer that are exposed to the exposure light and not exposed to the exposure light, and then depositing a solution containing a conductive material on the insulating film,
   wherein during said rinsing neither the exposed portions or the unexposed portions is removed.

2. The method of manufacturing a semiconductor device according to claim 1, wherein the method of depositing the photosensitive self-assembled monolayer is conducted by a coating method or a dipping method.

3. The method of manufacturing a semiconductor device according to claim 2, wherein the coating method is at least one of methods selected from the group consisting of an inkjet method, microdispensing method, casting method, dipping method, and transfer method.

4. The method of manufacturing a semiconductor device according to claim 1, wherein the substrate and the insulating film have transparency to the exposure light.

5. The method of manufacturing a semiconductor device according to claim 1, wherein the substrate and the insulating film comprise a material transparent to the exposure light and the lower electrode comprises a material non-transparent to the exposure light.

6. The method of manufacturing a semiconductor device according to claim 1, wherein the material for the source and drain electrodes uses a solution containing metal nano particles as a starting material.

7. The method of manufacturing a semiconductor device according to claim 1, wherein the material for the source and drain electrodes uses a solution containing a conductive polymer as a starting material.

8. The method of manufacturing a semiconductor device according to claim 1, wherein the irradiation of the exposure light is conducted from the rear face of the substrate.

9. The method of manufacturing a semiconductor device according to claim 8, wherein the wavelength of the exposure light from the rear face of the substrate is a wavelength of a light absorption band of the photosensitive self-assembled monolayer.

10. The method of manufacturing a semiconductor device according to claim 1, wherein the channel portion, the insulating film, the lower electrode, the source and the drain electrodes are formed by a printing method.

11. The method of manufacturing a semiconductor device according to claim 1, wherein the water contact angle of the photosensitive self-assembled monolayer is different before and after the irradiation step of the exposure light and the treatment step with the aqueous organic alkali solution.

12. The method of manufacturing a semiconductor device according to claim 1, wherein the water contact angle of the photosensitive self-assembled monolayer after the irradiation step of the exposure light and the treatment step with the aqueous organic alkali solution is smaller than the contact angle before practicing both of the steps.

13. The method of manufacturing a semiconductor device according to claim 1, wherein the formation of the organic semiconductor film is conducted after the step of forming the source and drain electrodes.

14. The method of manufacturing a semiconductor device according to claim 1, wherein the substrate is a flexible substrate.

15. The method of manufacturing a semiconductor device according to claim 1, wherein the substrate comprises a silicon compound.

16. The method of manufacturing a semiconductor device according to claim 1, wherein the substrate comprises an organic compound.

17. The method of manufacturing a semiconductor device according to claim 1, wherein said aqueous organic alkali solution is a 2 wt% to 25 wt% aqueous solution of organic ammonium hydroxide compounds.

18. The method of manufacturing a semiconductor device according to claim 17, wherein said organic ammonium hydroxide compounds are selected from the group consisting of tetramethyl ammonium hydroxide and tetrabutyl ammonium hydroxide.

19. The method of manufacturing a semiconductor device according to claim 1, wherein both the exposed portions and the unexposed portions of the photosensitive self-assembled monolayer are rinsed during said rinsing.

20. The method of manufacturing a semiconductor device according to claim 1, wherein, during said rinsing, initially the aqueous organic alkali solution is used, and then the water is used.

21. The method of manufacturing a semiconductor device according to claim 1, wherein said rinsing is a rinse cleaning of the photosensitive self-assembled monolayer.

22. A method of manufacturing a semiconductor device comprising the steps of:
    forming an insulating film above a substrate;
    depositing a photosensitive self-assembled monolayer on the insulating film and irradiating exposure light to a predetermined region;
    rinsing the photosensitive self-assembled monolayer obtained after the irradiation by using an aqueous organic alkali solution and water so as to increase a difference of water contact angle between portions of the photosensitive self-assembled monolayer that are exposed to the exposure light and not exposed to the exposure light, wherein during said rinsing neither the exposed portions or the unexposed portions is removed; and
    depositing a solution containing a conductive material on the insulating film thereby forming a conductive region in the predetermined region.

23. The method of manufacturing a semiconductor device according to claim 22, wherein both the exposed portions and the unexposed portions of the photosensitive self-assembled monolayer are rinsed during said rinsing.

24. The method of manufacturing a semiconductor device according to claim 22, wherein, during said rinsing, initially the aqueous organic alkali solution is used, and then the water is used.

25. The method of manufacturing a semiconductor device according to claim 22, wherein said rinsing is a rinse cleaning of the photosensitive self-assembled monolayer.

* * * * *